(12) United States Patent
Chen et al.

(10) Patent No.: US 11,610,864 B2
(45) Date of Patent: Mar. 21, 2023

(54) CHIP PACKAGE STRUCTURE AND METHOD OF FORMING THE SAME

(71) Applicant: Taiwan Semiconductor Manufacturing Co., Ltd., Hsinchu (TW)

(72) Inventors: Shuo-Mao Chen, New Taipei (TW); Shin-Puu Jeng, Hsinchu (TW); Feng-Cheng Hsu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 176 days.

(21) Appl. No.: 16/984,369

(22) Filed: Aug. 4, 2020

(65) Prior Publication Data

US 2021/0074682 A1    Mar. 11, 2021

Related U.S. Application Data

(60) Provisional application No. 62/897,461, filed on Sep. 9, 2019.

(51) Int. Cl.
| | | |
|---|---|---|
| *H01L 25/065* | (2006.01) | |
| *H01L 23/498* | (2006.01) | |
| *H01L 21/56* | (2006.01) | |
| *H01L 23/00* | (2006.01) | |

(52) U.S. Cl.
CPC ........ *H01L 25/0657* (2013.01); *H01L 21/563* (2013.01); *H01L 23/49816* (2013.01); *H01L 23/49838* (2013.01); *H01L 24/13* (2013.01); *H01L 24/50* (2013.01); *H01L 24/81* (2013.01)

(58) Field of Classification Search
CPC .................................................. H01L 25/0657
See application file for complete search history.

(56) References Cited

U.S. PATENT DOCUMENTS

| | | |
|---|---|---|
| 8,865,521 B2 | 10/2014 | Jeng et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |

(Continued)

*Primary Examiner* — William A Harriston
(74) *Attorney, Agent, or Firm* — McClure, Qualey & Rodack, LLP

(57) ABSTRACT

A package structure and a method of forming the same are provided. The package structure includes a package substrate and an interposer substrate over the package substrate. The interposer substrate has a first surface facing the package substrate and a second surface opposite the first surface. A first semiconductor device is disposed on the first surface, and a second semiconductor device is disposed on the second surface. Conductive structures are disposed between the interposer substrate and the package substrate. The first semiconductor device is located between the conductive structures. A first side of the first semiconductor device is at a first distance from the most adjacent conductive structure, and a second side of the first semiconductor device is at a second distance from the most adjacent conductive structure. The first side is opposite the second side, and the first distance is greater than the second distance.

20 Claims, 12 Drawing Sheets

(56) References Cited

U.S. PATENT DOCUMENTS

| | | |
|---|---|---|
| 9,496,189 B2 | 11/2016 | Yu et al. |
| 9,666,502 B2 | 5/2017 | Chen et al. |
| 9,735,131 B2 | 8/2017 | Su et al. |
| 2016/0064328 A1* | 3/2016 | Kwon ................ H01L 25/0652 438/109 |

* cited by examiner

CHIP PACKAGE STRUCTURE AND METHOD OF FORMING THE SAME

PRIORITY CLAIM AND CROSS-REFERENCE

This application claims the benefit of U.S. Provisional Application No. 62/897,461, filed on Sep. 9, 2019, the entirety of which is incorporated by reference herein.

BACKGROUND

Integrated circuits (ICs) are made practical by technological advancements in semiconductor device fabrication. The size, speed, and capacity of chips have progressed enormously, driven by technical advances that fit more and more elements on chips of the same size. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less area or are lower in height, have been developed to package the semiconductor devices.

Although existing packaging techniques have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
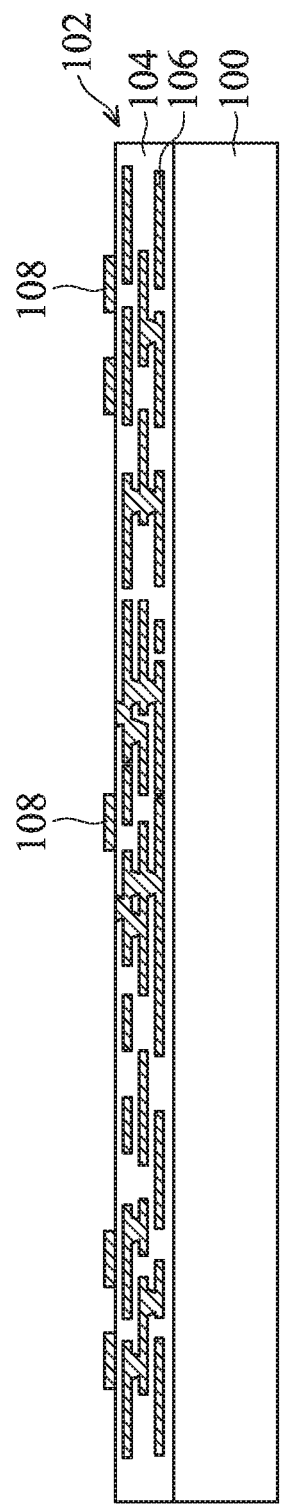
FIGS. 1A-1E are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the package structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1E are cross-sectional views of various stages of a process for forming a package structure, in accordance with some embodiments. As shown in FIG. 1A, a package substrate 102 is formed over a carrier substrate 100, in accordance with some embodiments. The carrier substrate 100 may be a glass substrate, semiconductor substrate, or another suitable substrate. The package substrate 102 may be used to provide electrical connection between the semiconductor devices (which will be described later) in the package structure and an external electronic device, after the carrier substrate 100 is removed at a subsequent stage (illustrated in FIG. 1E).

The package substrate 102 may be used for routing. In some embodiments, the package substrate 102 is a redistribution substrate. In some alternative embodiments, the package substrate 102 is a build-up substrate including a core and build-up layers on opposing sides of the core. In some other embodiments, the package substrate 102 is a glass substrate. In the subsequent discussion of the embodiments of the present disclosure, a redistribution substrate is illustrated as an example of the package substrate 102, while the teaching revealed in accordance with the example embodiments are readily applicable for build-up substrates or glass substrates. The package substrate 102 includes multiple laminated insulating layers 104 and multiple conductive features 106 surrounded by the insulating layers 104, as shown in FIG. 1A. The conductive features 106 may include conductive lines, conductive vias, and/or conductive pads. In some embodiments, some of the conductive vias are stacked with each other. The upper conductive via is substantially aligned with the lower conductive via so as to have a shorter routing length. However, some of the conductive vias may be staggered vias in some cases with restricted routing. The upper conductive via is misaligned with the lower conductive via.

The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104.

In some other embodiments, some or all of the insulating layers 104 are made of or include dielectric materials other than polymer materials. The dielectric material may include silicon oxide, silicon carbide, silicon nitride, silicon oxynitride, one or more other suitable materials, or a combination thereof.

The conductive features 106 may include conductive lines providing electrical connection in horizontal directions and conductive vias providing electrical connection in vertical directions. The conductive features 106 may be made of or include copper, aluminum, gold, cobalt, titanium, nickel, silver, graphene, one or more other suitable conductive materials, or a combination thereof. In some embodiments, the conductive features 106 include multiple sub-layers. For example, each of the conductive features 106 contains multiple sub-layers including Ti/Cu, Ti/Ni/Cu, Ti/Cu/Ti, Al/Ti/Ni/Ag, other suitable sub-layers, or a combination thereof.

The formation of the package substrate 102 may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

As shown in FIG. 1A, the package substrate 102 also has conductive elements 108 formed thereon, in accordance with some embodiments. Each conductive element 108 may be exposed at or protruding from the topmost surface of the insulating layers 104, and may be electrically connected to one of the conductive features 106. The conductive elements 108 may be used to electrically coupled to, hold or receive an interposer substrate, which will be described later.

The conductive elements 108 may be made of or include copper, aluminum, gold, cobalt, titanium, tin, one or more other suitable materials, or a combination thereof. The conductive elements 108 may be formed using an electroplating process, an electroless plating process, a placement process, a printing process, a physical vapor deposition (PVD) process, a chemical vapor deposition (CVD) process, one or more other applicable processes, or a combination thereof.

Figure 1B:
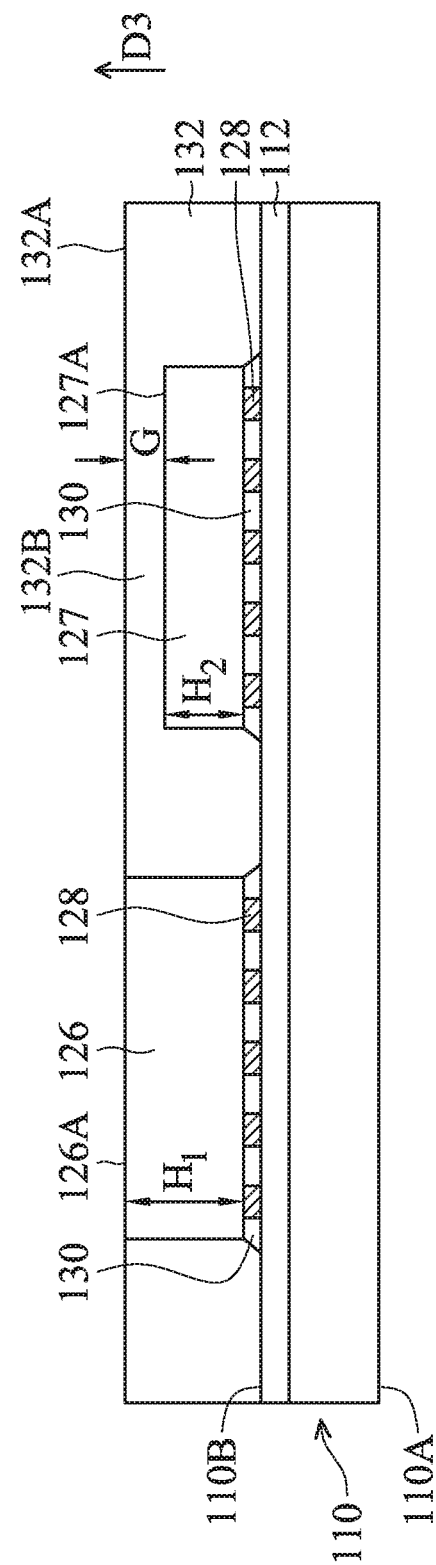

As shown in FIG. 1B, an interposer substrate 110 to be disposed over the package substrate 102 (in FIG. 1A) is provided, in accordance with some embodiments. The interposer substrate 110 may be a semiconductor substrate, which may further be a crystalline silicon substrate, although it may comprise other semiconductor materials such as silicon germanium, silicon carbon, or the like. Although not shown, the interposer substrate 110 may further include insulating layers and conductive layers formed therein. In various embodiments, the interposer substrate 110 may or may not include passive devices (such as resistors, capacitors, inductors, or the like) and/or active devices (such as transistors, diodes, or the like) formed therein or thereon. In some other embodiments, the interposer substrate 110 may be an organic substrate including multiple laminated insulating layers and multiple conductive features surrounded by the insulating layers (similar to the package substrate 102 shown in FIG. 1A described above), or the interposer substrate 110 may be a glass substrate.

As shown in FIG. 1B, an interconnect structure layer 112, sometimes referred to as redistribution layer (RDL), is formed on a side of the interposer substrate 110, and is used to electrically connect to an internal circuitry (not shown) of the interposer substrate 110 or devices over the interposer substrate 110, in accordance with some embodiments. Although not shown, the interconnect structure layer 112 may include a plurality of dielectric layers. Metal lines are formed in the dielectric layers. Conductive vias are formed between, and interconnecting, the overlying and underlying metal lines. Electrical connectors (also called pad regions) may be exposed or formed at the top surface of the interconnect structure layer 112 to receive and interconnect to external devices (which will be described later). In accordance with some embodiments, the dielectric layers is formed of silicon oxide, silicon nitride, silicon carbide, silicon oxynitride, combinations thereof, and/or multi-layers thereof. Alternatively, the dielectric layers may comprise one or more low-k dielectric layer having low k values. The materials of the metal lines, conductive vias and the electrical connector (collectively called conductive features) may be the same or similar to those of the conductive features 106 illustrated in FIG. 1A.

As shown in FIG. 1B, semiconductor devices 126 and semiconductor devices 127 are bonded to the interposer substrate 110 through flip-chip bonding, in accordance with some embodiments (for simplicity, only one semiconductor device 126 and only one semiconductor device 127 are shown). In some embodiments, each semiconductor device 126/127 is stacked or disposed over a surface 110B of the interposer substrate 110, and is boned onto some exposed pad regions (e.g., constructed by some of the conductive features of the interconnect structure layer 112) of the interposer substrate 110 through conductive structures 128. The conductive structures 128 may include conductive pillars, solder balls, controlled collapse chip connection (C4) bumps, micro bumps, one or more other suitable bonding structures, or a combination thereof.

In some embodiments, the conductive structures 128 are made of or include a metal material, such as copper, aluminum, gold, nickel, silver, palladium, or the like, or a combination thereof. The conductive structures 128 may be formed using an electroplating process, an electroless plating process, a placement process, a printing process, a physical vapor deposition (PVD) process, a chemical vapor deposition (CVD) process, a photolithography process, one or more other applicable processes, or a combination thereof.

In some other embodiments, the conductive structures 128 are made of a tin-containing material. The tin-containing material may further include copper, silver, gold, aluminum, lead, one or more other suitable materials, or a combination thereof. In some other embodiments, the conductive structures 128 are lead-free. In addition, a reflow process may be performed in order to shape the tin-containing material into the desired bump or ball shapes.

In some embodiments, an underfill element 130 is formed to surround and protect the conductive structures 128, and enhances the connection between the semiconductor devices 126/127 and the interposer substrate 110, as shown in FIG. 1B. The underfill element 130 may be made of or include an insulating material such as an underfill material. The underfill material may include an epoxy, a resin, a filler material, a stress release agent (SRA), an adhesion promoter, another suitable material, or a combination thereof. In some embodiments, an underfill material in liquid state is dispensed into a gap between each semiconductor device 126/127 and the interposer substrate 110 to reinforce the strength of the conductive structures 128 and therefore the overall package structure. After the dispensing, the underfill material is cured to form the underfill element 130. The underfill element 130 may also provide a thermal conduction path for the package structure. In this embodiments, the underfill element 130 fills the whole gap between each semiconductor device 126/127 and the interposer substrate 110, and covers all the lower surface of each semiconductor device 126/127. In some other embodiments, the underfill element 130 is not formed, or merely covers portions of the lower surface of each semiconductor device 126/127.

In accordance with embodiments, each of the semiconductor devices 126 and 127 includes a semiconductor chip, one or more active devices (such as a transistor, diode, photodiode, or the like), one or more passive device (such as a resistor, capacitor, inductor, or the like), a package module including a package substrate and one or more semiconductor chips or dies mounted thereon (see FIG. 6, for example), or a combination thereof. The semiconductor chip may include any type of functional integrated circuit, such as a processor, logic circuitry, memory, analog circuit, digital circuit, mixed signal circuit, or the like. In some embodiments, the semiconductor devices 126 and 127 are different types of electronic devices that provide different functions. For example, the semiconductor devices 126 are processor devices, while the semiconductor devices 127 are memory devices, but other combinations can also be used. In some other embodiments, the semiconductor devices 126 and 127 are the same type of electronic devices.

In some embodiments, the semiconductor devices 126 and 127 are of different sizes. For example, as shown in FIG. 1B, the height H1 of each semiconductor device 126 in a direction D3 perpendicular to the surface 110B is greater than the height H2 of each semiconductor device 127 in the direction D3. However, the semiconductor devices 126 and 127 may also have the same size (e.g., height), in some other embodiments.

As shown in FIG. 1B, a protective layer 132 is formed over the interposer substrate 110 to surround and protect the semiconductor devices 126 and 127, in accordance with some embodiments. In some embodiments, the protective layer 132 is separated from the conductive structures 128 below the semiconductor devices 126 and 127 by the underfill element 130. However, embodiments of the disclosure are not limited thereto. In some other embodiments, the underfill element 130 is not formed. In these cases, the protective layer 132 may be in direct contact with the conductive structures 128 below the semiconductor devices 126 and 127.

In some embodiments, the protective layer 132 is made of or includes an insulating material such as a molding material. The molding material may include a polymer material, such as an epoxy-based resin with fillers dispersed therein. In some embodiments, a molding material (such as a liquid molding material) is dispensed onto the surface 110B of the interposer substrate 110 and/or over the semiconductor devices 126 and 127. In some embodiments, a thermal process is then used to cure the liquid molding material and to transform it into the protective layer 132.

In some embodiments, a planarization process is then applied on the protective layer 132 to partially remove the protective layer 132. In some embodiments as shown in FIG. 1B, after the planarization process, the top surface 126A of the semiconductor device 126 is exposed and substantially flush with the top surface 132A of the protective layer 132. This facilitates rapid heat dissipation from the semiconductor devices 126 and avoids overheating. In addition, after the planarization process, the top surface 127A of the semiconductor device 127 is separated from the top surface 132A of the protective layer 132 by a gap G (i.e., the semiconductor device 127 is covered by a portion 132B of the protective layer 132). Being covered and pressed by the cover portion 132B, warpage in the semiconductor devices 127 that is likely to occur during reflow or thermal processes can be reduced. The planarization process may include a grinding process, a chemical mechanical polishing (CMP) process, an etching process, a dry polishing process, one or more other applicable processes, or a combination thereof.

Figure 1C:
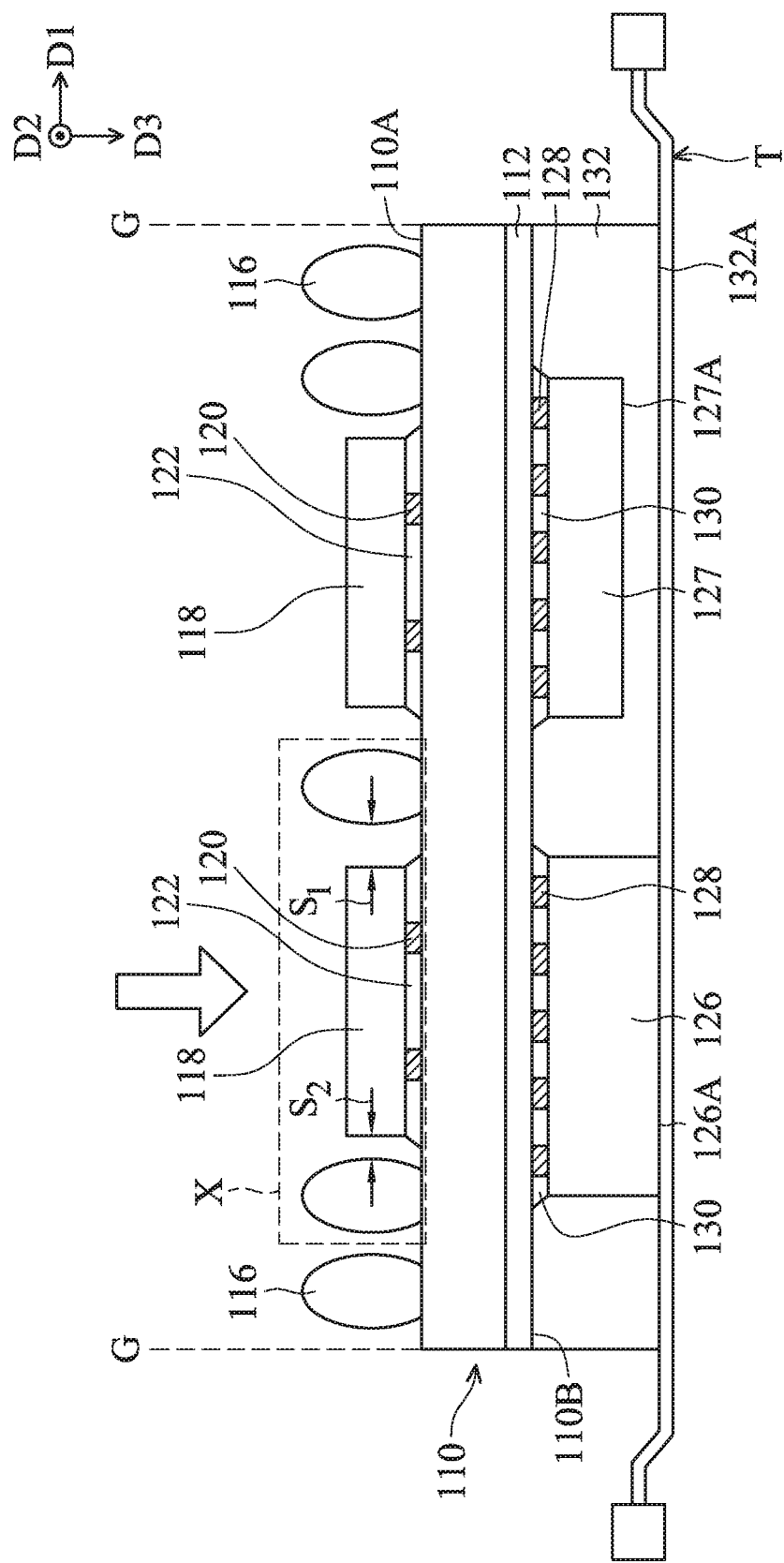

As shown in FIG. 1C, the resulting structure of FIG. 1B is turned upside down and is placed so that the protective layer 132 side is affixed to a dicing tape T, in accordance with some embodiments. Afterwards, conductive structures 116 are formed on another surface 110A of the interposer substrate 110 opposite the surface 110B mounted with the semiconductor devices 126 and 127, in accordance with some embodiments. In some embodiments, each conductive structure 116 is formed onto and electrically connected to a pad region (constructed by one of the conductive layers in the interposer substrate 110) exposed at the surface 110A. The conductive structures 116 may be used to bond (e.g., electrically connect) the interposer substrate 110 to the package substrate 102, which will be described later. The conductive structures 116 may include conductive pillars, solder balls, controlled collapse chip connection (C4) bumps, micro bumps, one or more other suitable bonding structures, or a combination thereof. The structure, materials, and formation method of the conductive structures 116 may be the same or similar to those of the conductive structures 128 illustrated in FIG. 1B. In cases where the conductive structures 116 are made of or include a tin-containing material, a reflow process may be performed in order to shape the tin-containing material into the desired bump or ball shapes.

As shown in FIG. 1C, several semiconductor devices 118 (for illustration, two semiconductor devices 118 are shown) are stacked or disposed over the interposer substrate 110, in accordance with some embodiments. In some embodiments, each of the semiconductor devices 118 is a functional IC chip, which may include one or more application processors, logic circuits, memory devices, power management integrated circuits, analog circuits, digital circuits, mixed signal circuits, one or more other suitable functional integrated circuits, or a combination thereof. In some other embodiments, each of the semiconductor devices 118 includes one or more passive elements such as resistors, capacitors, inductors, or the like, or each of the semiconductor devices 118 includes one or more active elements such as diodes, transistors, or the like. In some other embodiments, each of the semiconductor devices 118 includes a package module including a package substrate and one or more semiconductor chips or dies mounted thereon (see FIG. 6, for example). Alternatively, each of the semiconductor devices 118 is a semiconductor die with metallic routing only (i.e., without a functional IC chip, device or module) used for routing in some other embodiments.

In some embodiments, the semiconductor devices 118 are different types of electronic devices that provide different functions. For example, some semiconductor devices 118 may be memory devices, while some other semiconductor devices 118 may be capacitors. However, other combinations of the semiconductor devices 118 can also be used. In some other embodiments, the semiconductor devices 118 are the same type of electronic devices.

In addition, although the semiconductor devices 118 shown have the same size (e.g., the same height in the direction D3), they may have different sizes in some other embodiments. In some embodiments, the height of the semiconductor devices 118 is smaller than the height of the conductive structures 116, as shown in FIG. 1C. However, the disclosure is not limited thereto, and the height of the conductive structures 116 may be smaller than the height of the semiconductor devices 118, in some other embodiments (which will be described later).

Each semiconductor device 118 may be bonded onto some pad regions exposed at the surface 110A of the interposer substrate 110, which have not been occupied by the conductive structures 116, through conductive structures 120, as shown in FIG. 1C. In some other embodiments, the semiconductor devices 118 may be attached to the interposer substrate 110 prior to the installation of the conductive structures 116. In some embodiments, the semiconductor devices 118 is interconnected to the interposer substrate 110 through another interconnect structure layer (like the interconnect structure layer 112) formed over the interposer substrate 110. The conductive structures 120 may include conductive pillars, solder balls, controlled collapse chip connection (C4) bumps, micro bumps, one or more other suitable bonding structures, or a combination thereof. The structure, materials, and formation method of the conductive structures 120 may be the same or similar to those of the conductive structures 116 described above.

In some embodiments, an underfill element 122 is formed to surround and protect the conductive structures 120 below each semiconductor device 118, and enhances the connection between the semiconductor device 118 and the interposer substrate 110, as shown in FIG. 1C. The underfill element 122 may further provide a thermal conduction path for the package structure. The structure, materials, and formation method of the underfill element 122 may be the same or similar to those of the underfill element 130 illustrated in FIG. 1B.

Figure 2:
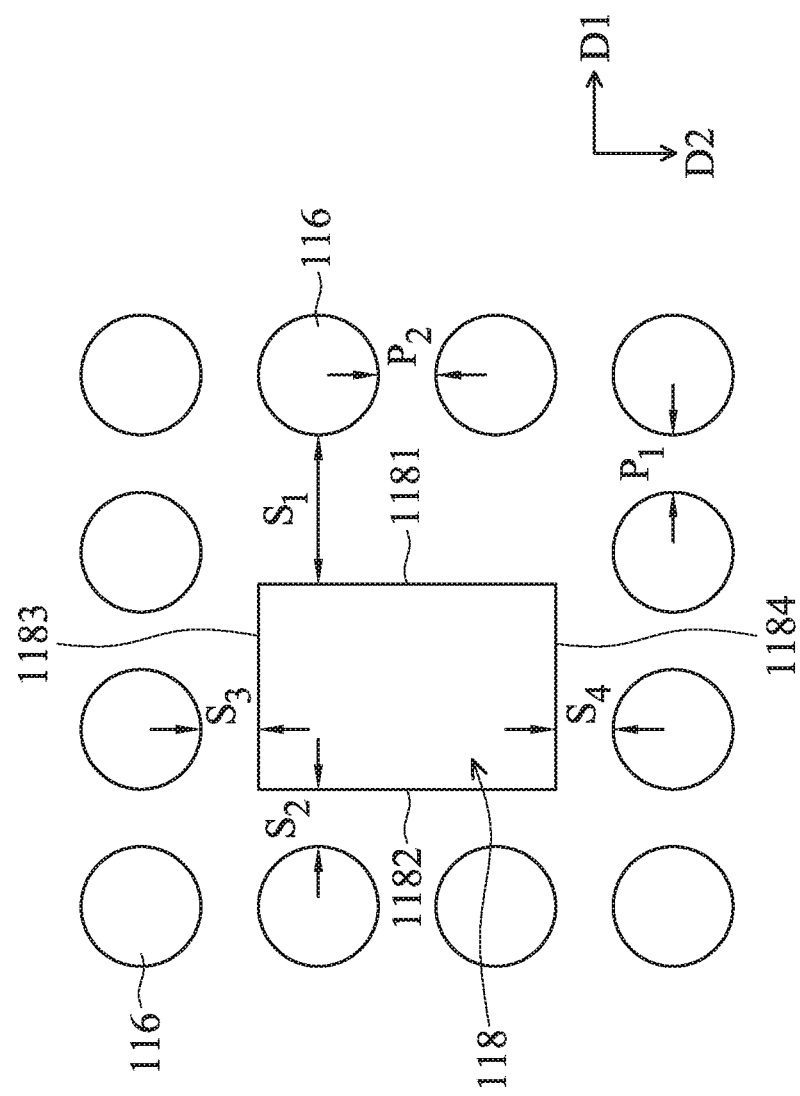
FIG. 2 is a top view of a region X in FIG. 1C, in accordance with some embodiments.

Next, referring to FIG. 2, which is a top view of a region X in FIG. 1C, illustrating the arrangement of one semiconductor device 118 and adjacent conductive structures 116, in accordance with some embodiments. The conductive structures 116 are arranged in an array of orthogonal rows and columns. In some embodiments, the conductive structures 116 have a uniform pitch P1 between every two adjacent conductive structures 116 arranged in a first direction D1, and a uniform pitch P2 between every two adjacent conductive structures 116 arranged in a second direction D2 perpendicular to the first direction D1. The pitch P1 may be equal to the pitch P2, but embodiments of the disclosure are not limited thereto. In some other embodiments, the pitch P1 may be greater or less than the pitch P2. In addition, an angle that is greater than 0 degrees and less than 90 degrees may be formed between the first direction D1 and the second direction D2, in some different cases.

In some embodiments, when viewed in the direction D3 perpendicular to the surface 110A of the interposer substrate 110 (as indicated by an arrow in FIG. 1B), one semiconductor device 118 is surrounded or encircled by several conductive structures 116, as shown in FIG. 2. The semiconductor device 118 has a first side 1181 and a second side 1182 opposite each other and perpendicular to the first direction D1, and has a third side 1183 and a fourth side 1184 opposite each other and perpendicular to the second direction D2.

In some embodiments as shown in FIG. 2, the distance S1 from the first side 1181 to the most adjacent conductive structure 116 in the first direction D1 is greater than the distance S2 from the second side 1182 to the most adjacent conductive structure 116 in the first direction D1. The distance S1 may be greater than or equal to twice the pitch P1 and less than three times the pitch P1 (i.e., $2P1 \leq S1 < 3P1$). Also, the distance S2 may be greater than or equal to the pitch P1 and less than twice the pitch (i.e., $P1 \leq S2 < 2P1$). For example, in cases where the pitch P1 is about 130 μm, the distance S1 is greater than or equal to 260 μm and less than 390 μm, and the distance S2 is greater than or equal to 130 μm and less than 260 μm. However, other suitable values can also be used in different cases.

In some embodiments, the distance S3 from the third side 1183 to the most adjacent conductive structure 116 in the second direction D2 is equal to the distance S4 from the fourth side 1184 to the most adjacent conductive structure 116 in the second direction D2, as shown in FIG. 2. Each of the distance S3 and distance S4 may be greater than or equal to the pitch P2 and less than twice the pitch P2 (i.e., P2≤S3<2P2, and P2≤S4<2P2). For example, in cases where the pitch P2 is about 130 μm, both the distance S3 and distance S4 are greater than or equal to 130 μm and less than 260 μm. However, other suitable values can also be used in different cases.

It should be appreciated that the distance from one side (e.g., the first side 1181) of the semiconductor device 118 to the most adjacent conductive structure 116 is designed to be greater than the distance from another side (e.g., the second side 1182, third side 1183, or the fourth side 1184) of the semiconductor device 118 to the most adjacent conductive structure 116, and especially greater than twice the pitch between every two adjacent conductive structures 116 (as described above), which facilitates the injection of the underfill material (of underfill element 122) through the first side 1181 to the gap between each semiconductor device 118 and the interposer substrate 110. In addition, a larger space left on a side (e.g., the first side 1181) of the semiconductor device 118 also helps to dissipate heat generated from the semiconductor device 118 through this side. On the other hand, the distance between other side (e.g., the side S2, S3 or S4) of the semiconductor device 118 and its most adjacent conductive structure 116 is designed to be greater than the pitch between every two adjacent conductive structures 116 (as described above), which helps prevent the semiconductor device 118 from short circuiting or bridging to adjacent conductive structures 116.

Additionally, the distance from each side of the semiconductor device 118 to its most adjacent conductive structure 116 is designed to be less than twice or three times the pitch between every two adjacent conductive structures 116 (as described above), which helps to maintain a larger installation space for the conductive structures 116 over the interposer substrate 110.

Referring back to FIG. 1C, after the semiconductor devices 118 and the conductive structures 116 (as well as the underfill element 122) are disposed over the interposer substrate 110, a singulation process (also referred to as a saw process) is carried along cutting grooves C, to form multiple separate package structures, in accordance with some embodiments. In FIG. 1C, one of the package structures (e.g., a chip-on-wafer (CoW) package structure) is shown. Afterward, each package structure is removed from the dicing tape T by using a pick-and-place tool (not shown).

Figure 1D:
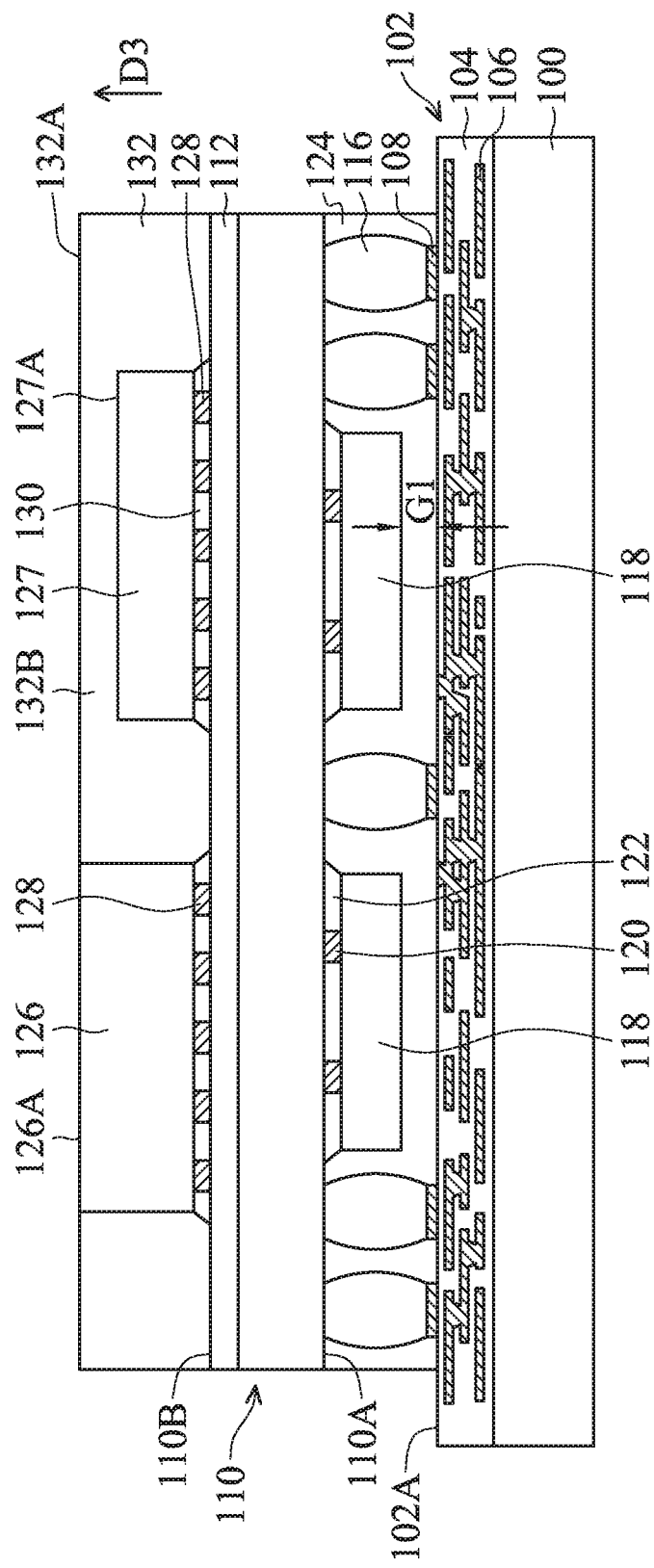

As shown in FIG. 1D, the resulting package structure of FIG. 1C is placed by the pick-and-place tool so that the semiconductor device 118 side faces the package substrate 102 and is stacked over the interposer substrate 110, in accordance with some embodiments. Afterwards, the interposer substrate 110 is bonded (e.g., electrically connected) to the conductive elements 108 over the package substrate 102 through the conductive structures 116 described above. In some other embodiments, the conductive elements 108 are not formed, and the interposer substrate 110 is bonded onto the pad regions (constructed by some of the conductive features 106) of the package substrate 102 through the conductive structures 116. In some embodiments, the interposer substrate 110 and the package substrate 102 are pressed against each other at an elevated temperature. As a result, the interposer substrate 110 is bonded to the package substrate 102 through the conductive structures 116. In some embodiments, a thermal compression process is used to achieve the bonding process mentioned above.

In some embodiments, each semiconductor device 118 below the interposer substrate 110 is separated from the package substrate 102 by a gap G1, as shown in FIG. 1D. The gap G1 (in the direction D3) may be greater than about 20 μm in some embodiments, but the disclosure is not limited thereto. As shown in FIG. 1D, an underfill element 124 is formed to surround and protect the conductive structures 116 between the interposer substrate 110 and the package substrate 102, in accordance with some embodiments. In some embodiments, the underfill element 124 also surrounds and protects the semiconductor devices 118 mounted on the interposer substrate 110. In some embodiments, a portion of the underfill element 124 is in the gap G1 between each semiconductor device 118 and the package substrate 102, so as to provide an additional thermal conduction path for the package structure. The materials and formation method of the underfill element 124 may be the same or similar to those of the underfill element 130 illustrated in FIG. 1B.

Figure 1E:
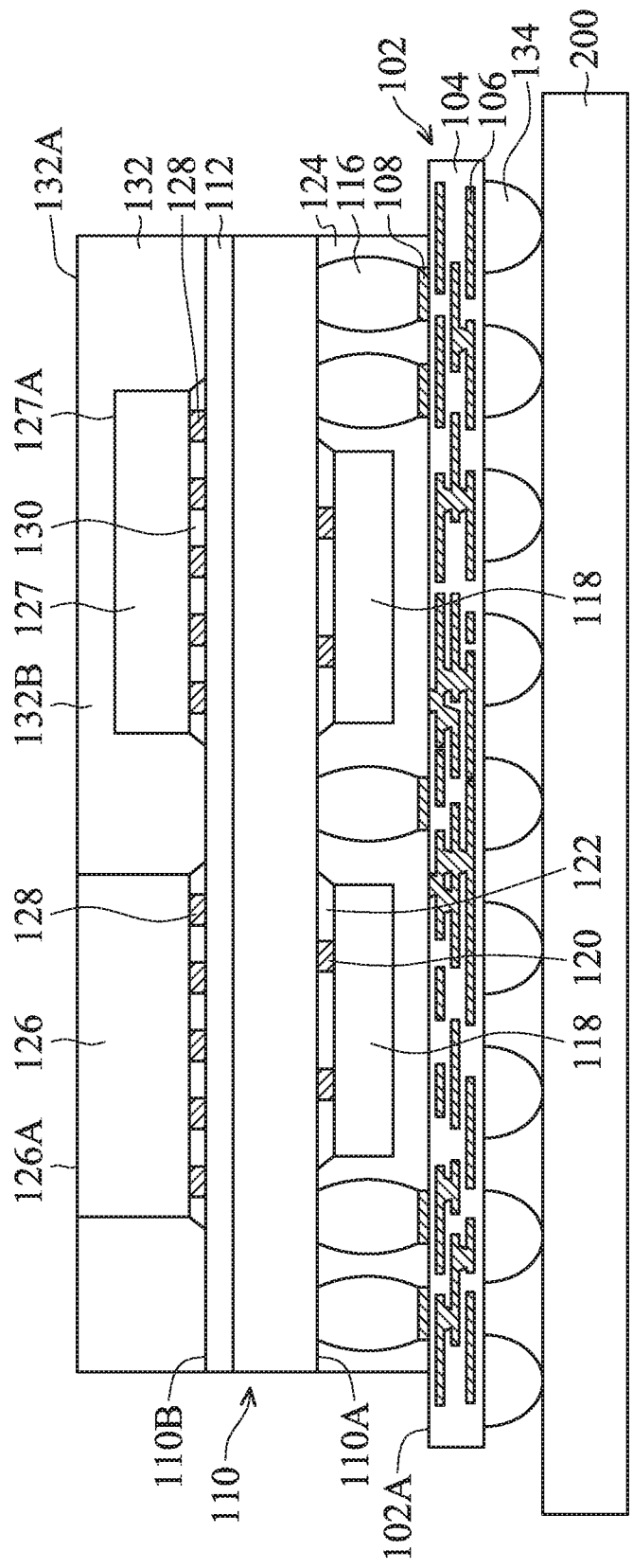

Afterwards, the carrier substrate 100 is removed to expose a surface of the package substrate 102, as shown in FIG. 1E in accordance with some embodiments. In some embodiments, a release film (not shown) is previously formed over the carrier substrate 100 before the formation of the package substrate 102. The release film is a temporary bonding material, which facilitates the separation operation between the carrier substrate 100 and the package substrate 102.

In some embodiments, conductive bumps 134 are then formed over the surface of the package substrate 102 that is originally covered by the carrier substrate, as shown in FIG. 1E. Each conductive bump 134 may be electrically connected to one of the conductive features 106 of the package substrate 102. The conductive bumps 134 may be used to bond the package structure 102 to an additional external electrical component 200, which may be a semiconductor substrate, a package substrate, a printed circuit board (PCB), a motherboard, or the like, as shown in FIG. 1E. The conductive bumps 134 may be or include solder bumps such as tin-containing solder bumps. The tin-containing solder bumps may further include copper, silver, gold, aluminum, lead, one or more other suitable materials, or a combination thereof. In some embodiments, the tin-containing solder bump is lead-free.

In some embodiments, solder balls (or solder elements) are disposed on the exposed conductive features 106 after the removal of the carrier substrate 100. A reflow process is then carried out to melt the solder balls into the conductive bumps 134. In some other embodiments, under bump metallization (UBM) elements are formed over the exposed conductive features 106 before the solder balls are disposed. In some other embodiments, solder elements are electroplated onto the exposed conductive features 106. Afterwards, a reflow process is used to melt the solder element to form the conductive bumps 134.

As a result, the process for forming the resulting package structure, which includes a chip-on-wafer-on-substrate (CoWoS) package structure, illustrated in FIG. 1E is completed. In some embodiments, the resulting package structure shown in FIG. 1E may also be referred to as an integrated fan-out (InFo) package structure as the package substrate 102 (such as a redistribution substrate) may refer to an InFo package substrate wherein an average distance between adjacent electrical connectors (e.g., conductive bumps 134) beneath the package substrate 102 is greater than an average distance between adjacent electrical connectors (e.g., conductive structures 116) above the package substrate 102. In the package structure in FIG. 1E, the semiconductor devices 118, 126 and 127 may communicate with each other through some of the conductive layers in the interposer substrate 110 instead of an additional wiring substrate. Accordingly, the RC delay and/or signal noise are significantly reduced (e.g., by passive elements mounted directly on the interposer substrate 110), and the signal transmission speed is improved. Consequently, the electrical performance (e.g., power integrity) of the overall package structure is improved.

In addition, as shown in FIG. 1E, the top surface 126A of the semiconductor device 126 is exposed from the protective layer 132. In cases where a large amount of heat may be generated from that semiconductor device 126 (e.g., a processor device) in operation, this facilitates rapid heat dissipation and avoids overheating. Moreover, the protective layer 132 has a portion 132B covering the top surface 127A of the semiconductor device 127. In some embodiments, the portion 132B covers substantially the entire top surface 127A of the semiconductor device 127. Thus, the portion 132B of the protective layer 132 may reduce bending or warpage in the semiconductor device 127 caused by the elevated temperatures used in the reflow processes or thermal processes. As a result, the performance and the reliability of the semiconductor devices in the package structure are also improved. Consequently, the overall performance (including the electrical and mechanical performance) and the reliability of the package structure are also improved.

Figure 3A:
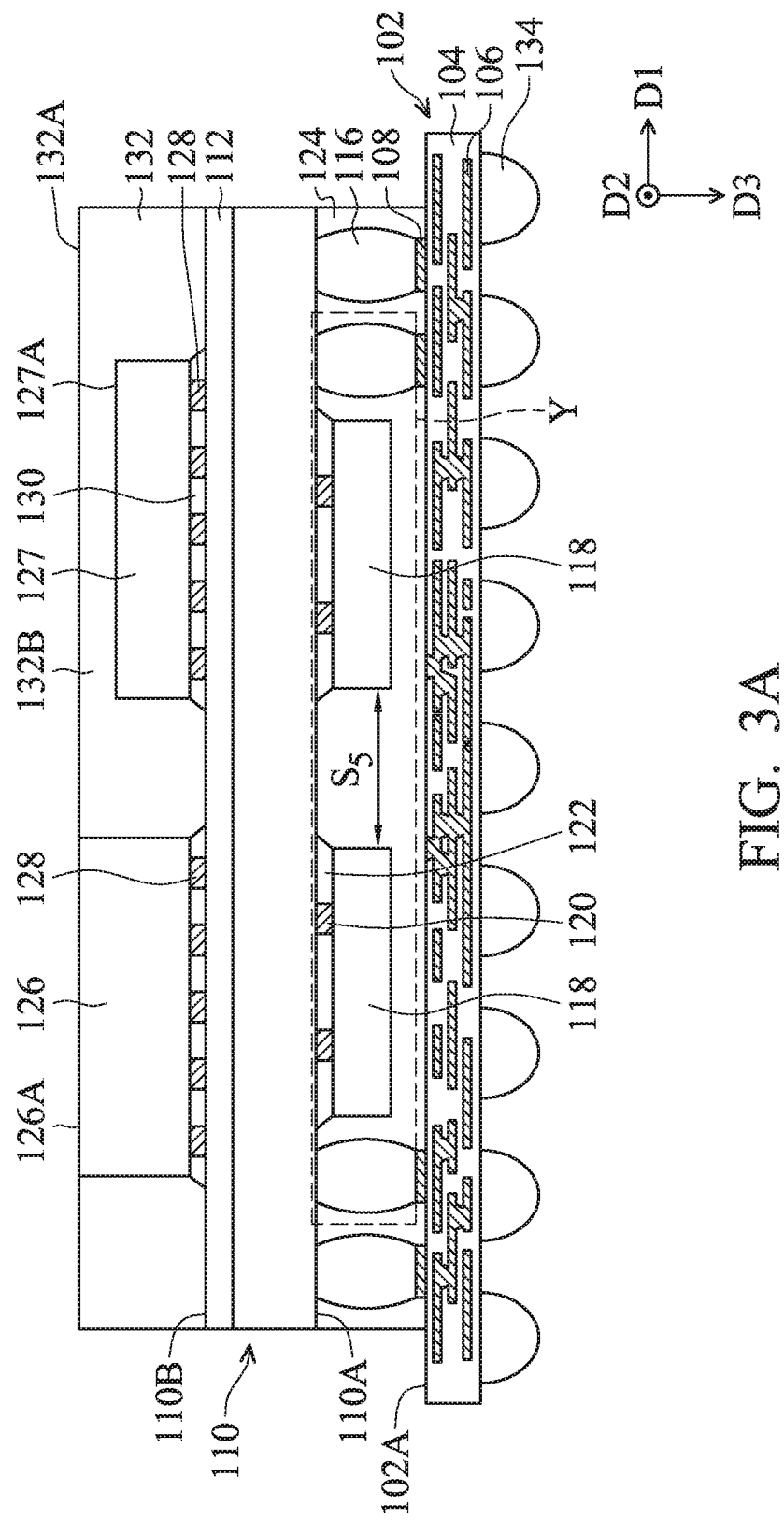
FIG. 3A is a cross-sectional view of a package structure, in accordance with some embodiments.

Many variations and/or modifications can be made to embodiments of the disclosure. FIG. 3A is a cross-sectional view of a package structure, in accordance with some embodiments. It should be appreciated that most of the structures in FIG. 3A are the same as those in FIG. 1E, so only the different parts are described here. As shown in FIG. 3A, two semiconductor devices 118 under the interposer substrate 110 are arranged side by side (i.e., no conductive structures 116 between them) in the direction D1, in accordance with some embodiments.

Figure 3B:
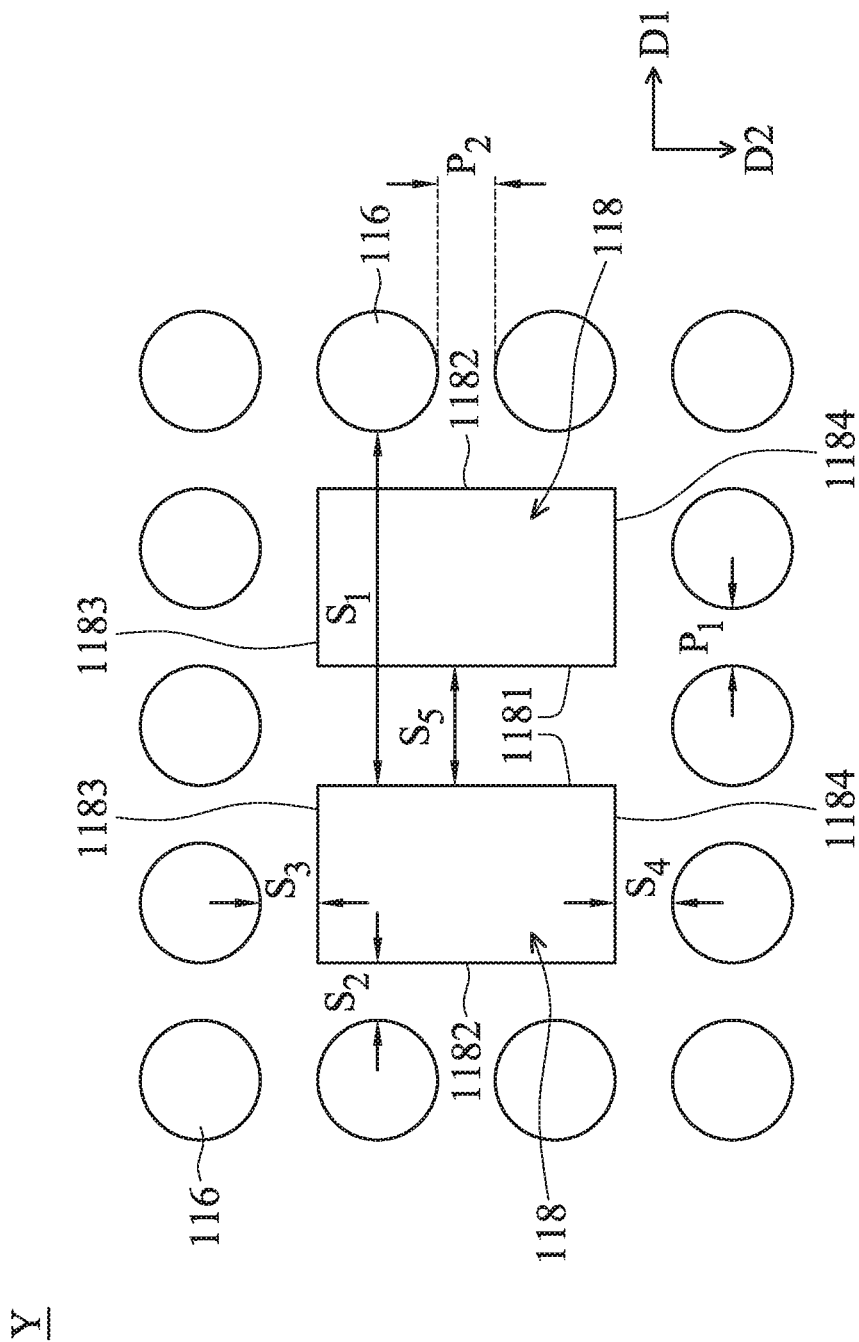
FIG. 3B is a top view of a region Y in FIG. 3A, in accordance with some embodiments.

FIG. 3B is a top view of a region Y in FIG. 3A, illustrating the arrangement of the two semiconductor devices 118 and adjacent conductive structures 116, in accordance with some embodiments. As shown in FIG. 3B, the conductive structures 116 are arranged in an array of orthogonal rows and columns with a uniform pitch P1 between every two adjacent conductive structures 116 arranged in a first direction D1 and a uniform pitch P2 between every two adjacent conductive structures 116 arranged in a second direction D2 perpendicular to the first direction D1, similar to the arrangement of the conductive structures 116 illustrated in FIG. 2. The two semiconductor devices 118 are surrounded or encircled by several conductive structures 116. Each semiconductor device 118 has a first side 1181 facing another adjacent semiconductor device 118, and has three other sides (e.g., the second side 1182, third side 1183, and the fourth side 1184) facing several conductive structures 116. The arrangement of each semiconductor device 118 and the adjacent conductive structures 116 may be similar to the arrangement of one semiconductor device 118 and the adjacent conductive structures 116 illustrated in FIG. 2, and therefore will not be repeated here.

As shown in FIG. 3B, the distance or space S5 between the first sides 1181 of the two first semiconductor devices 118 is designed to be greater than the distance S2 from the second side 1182 of each semiconductor device 118 to the most adjacent conductive structure 116, greater than the distance S3 from the third side 1183 of each semiconductor device 118 to the most adjacent conductive structure 116, and greater than the distance S4 from the fourth side 1184 of each semiconductor device 118 to the most adjacent conductive structure 116, in accordance with some embodiments. The space S5 may be greater than or equal to twice the pitch P1 (or the pitch P2) and less than three times the pitch P1 (or the pitch P2). For example, in cases where the pitch between every two adjacent conductive structures 116 is about 130 µm, the space S5 is greater than or equal to 260 µm and less than 390 µm. However, other suitable values can also be used in different cases.

It should be appreciated that the space S5 between the first sides 1181 of the two first semiconductor devices 118 is designed to be greater than the distance from other side (e.g., the second side 1182, third side 1183, or the fourth side 1184) of each semiconductor device 118 to its most adjacent conductive structure 116, and especially greater than twice the pitch between every two adjacent conductive structures 116 (as described above), which facilitates the injection of the underfill material (of underfill element 122) through the space of two adjacent semiconductor devices 118 to the gap between each semiconductor device 118 and the interposer substrate 110. In addition, a larger space left on a side (e.g., the first side 1181) of the semiconductor device 118 also helps to dissipate more heat generated from the semiconductor device 118.

Figure 4A:
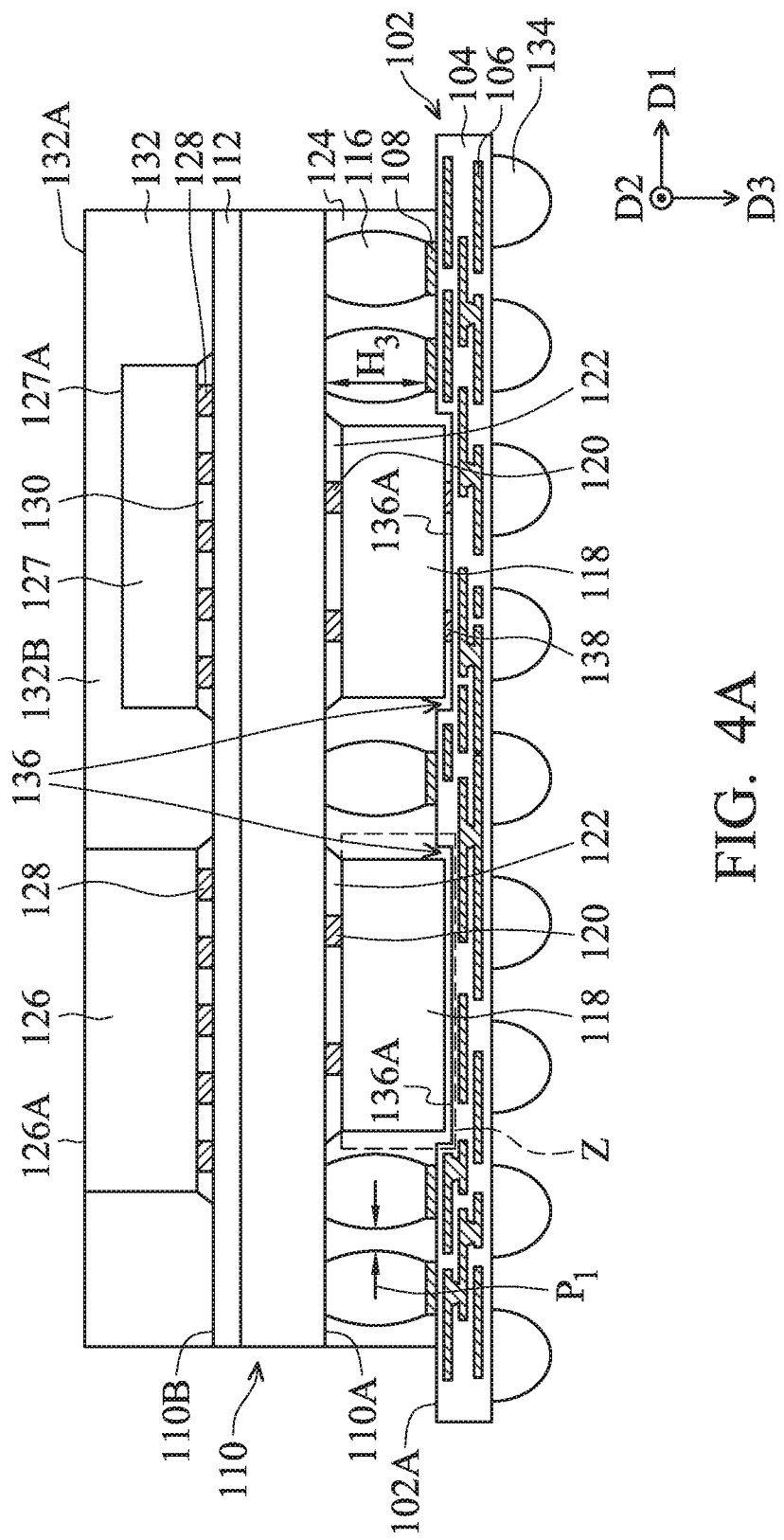
FIG. 4A is a cross-sectional view of a package structure, in accordance with some embodiments.

Many variations and/or modifications can be made to embodiments of the disclosure. FIG. 4A is a cross-sectional view of a package structure, in accordance with some embodiments. It should be appreciated that most of the structures in FIG. 4A are the same as those in FIG. 1E, so only the different parts are described here. As shown in FIG. 4A, several cavities 136 (for illustration, two cavities 136 are shown) are formed on the upper surface 102A of the package substrate 102 facing the interposer substrate 110, in accordance with some embodiments. As shown in FIG. 4A, each cavity 136 may have an appropriate depth in the direction D3 substantially perpendicular to the upper surface 102A in order to accommodate one semiconductor device 118 under the interposer substrate 110, after the interposer substrate 110 is stacked over the package substrate 102 as illustrated in FIG. 1D. In some embodiments, the (maximum) depth of the cavity 136 in the direction D3 does not exceed 50% of the thickness of the package substrate 102 in the direction D3 to maintain sufficient structural strength of the package substrate 102. In some other embodiments, more than one semiconductor devices 118 may be received in one cavity 136.

In some embodiments as shown in FIG. 4A, a portion of one semiconductor device 118 (e.g., the left one shown in the figure) extends into a corresponding cavity 136 of the package substrate 102, and the bottom of that semiconductor device 118 is separated from the bottom surface 136A of the cavity 136 by a gap (e.g., greater than about 20 µm). A portion of the underfill element 124 is in the gap between the semiconductor device 118 and the bottom surface 136A of the cavity 136, so as to provide an additional thermal conduction path for the package structure.

In some embodiments as shown in FIG. 4A, a portion of another semiconductor device 118 (e.g., the right one shown in the figure) extends into a corresponding cavity 136 of the package substrate 102, and that semiconductor device 118 is further electrically connected to the package substrate 102 at the bottom surface 136A of the cavity 136 through conductive structures 138 between the semiconductor device 118 and the pad regions (constructed by some of the conductive features 106) exposed at the bottom surface 136A. The conductive structures 138 enable electrical connection between the semiconductor device 118 (as well as the connected interposer substrate 110 and/or the semiconductor devices 126 and 127 thereon) and the package substrate 102 after the interposer substrate 110 is stacked over the package substrate 102. The conductive structures 138 may include conductive pillars, solder balls, controlled collapse chip connection (C4) bumps, micro bumps, one or more other suitable bonding structures, or a combination thereof. In some embodiments, the structure, materials, and formation method of the conductive structures 138 may be the same or similar to those of the conductive structures 120 illustrated in FIG. 1C.

In some embodiments, before stacking the interposer substrate 110 over the package substrate 102, the conductive structures 138 are formed on the surface of the semiconductor device 118 opposite the conductive structures 120, and are electrically connected to the exposed pad regions or electrodes of the semiconductor device 118. The conductive structures 138 also electrically connect to the internal circuitry of the semiconductor device 118. For example, several conductive through vias may be formed in and penetrating the semiconductor device 118 to interconnect the conductive structures 120 and the conductive structures 138 on opposite surfaces of the semiconductor device 118.

In some embodiments as shown in FIG. 4A, the underfill element 124 also surrounds and protects the conductive structures 138 between the semiconductor device 118 and the bottom surface 136A of the corresponding cavity 136, and enhances the connection between the semiconductor device 118 and the package substrate 102. For example, the underfill element 124 fills the gaps between the semiconductor device 118, the conductive structures 138, and the bottom surface 136A of the cavity 136. This also helps to provide an additional thermal path the package structure.

Figure 4B:
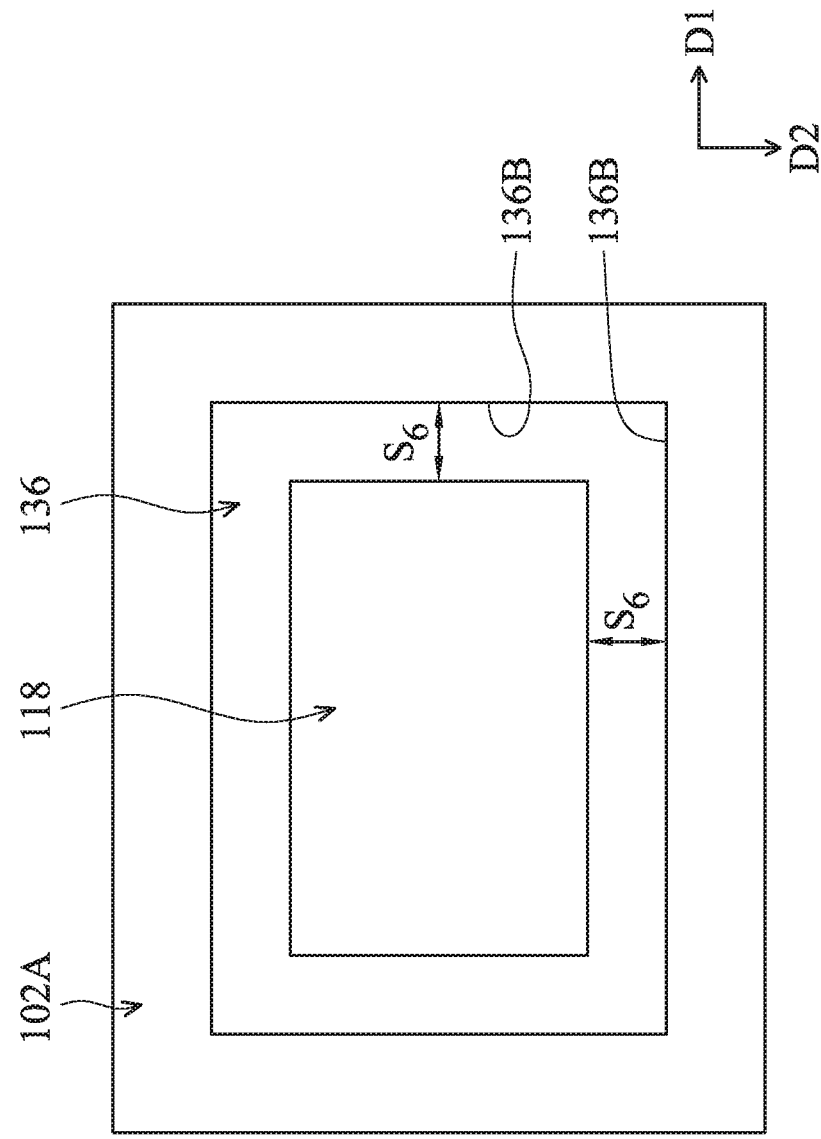
FIG. 4B is a top view of a region Z in FIG. 4A, in accordance with some embodiments.

FIG. 4B is a top view of a region Z in FIG. 4A, illustrating the arrangement of one semiconductor device 118 and the corresponding cavity 136 of the package substrate 102, in accordance with some embodiments. In some embodiments, when viewed in the direction D3 (in FIG. 4A) perpendicular to the upper surface 102A, the cavity 136 has a shape corresponding to the shape of the received semiconductor device 118, as shown in FIG. 4B. In addition, the cavity 136 is configured in such a way that each side of the semiconductor device 118 is spaced a uniform distance S6 from the adjacent wall 136B of the cavity 136. The distance S6 may be greater than or equal to the pitch P1 (see FIG. 4A) between every two adjacent conductive structures 116 arranged in the first direction D1 (or the pitch P2 between every two adjacent conductive structures 116 arranged in the second direction D2), and may be less than twice the pitch P1 (i.e., P1≤S6≤2P1). This helps to allow the semiconductor device 118 to easily enter the corresponding cavity 136 (as P1≤S6) and to maintain a larger installation space for the conductive structures 116 over the package substrate 102 (as S6<2P1). In cases where the pitch P1 (or the pitch P2) is about 130 μm, the distance S6 is greater than or equal to 130 μm and less than 260 μm. However, other suitable values can also be used in different cases.

In some embodiments, the cavities 136 are formed before disposing the interposer substrate 110 over the package substrate 102. The cavities 136 may be formed using a wet or dry etching process, an energy beam drilling process (such as a laser beam drilling process, an ion beam drilling process, or an electron beam drilling process), a mechanical drilling process, one or more other applicable processes, or a combination thereof.

In embodiments of FIG. 4A, the cavities 136 are formed on the package substrate 102 to accommodate the semiconductor devices 118, and therefore the height H3 of the conductive structures 116 in the direction D3 may be smaller than what would be possible using a package substrate 102 without a cavity. This is because the height of the conductive structures 116 no longer needs to be greater than the thickness of the semiconductor devices 118 in the direction D3. As a result, a thinner overall package structure can be obtained.

In addition, at least one of the semiconductor devices 118 integrated with the interposer substrate 110 may also be electrically connected to the underlying package substrate 102, thereby providing additional routing for the interposer substrate 110 to interconnect with the package substrate 102 (in addition to the conductive structures 116). As a result, the electrical performance of the overall package structure of FIG. 4A is further improved.

Figure 5:
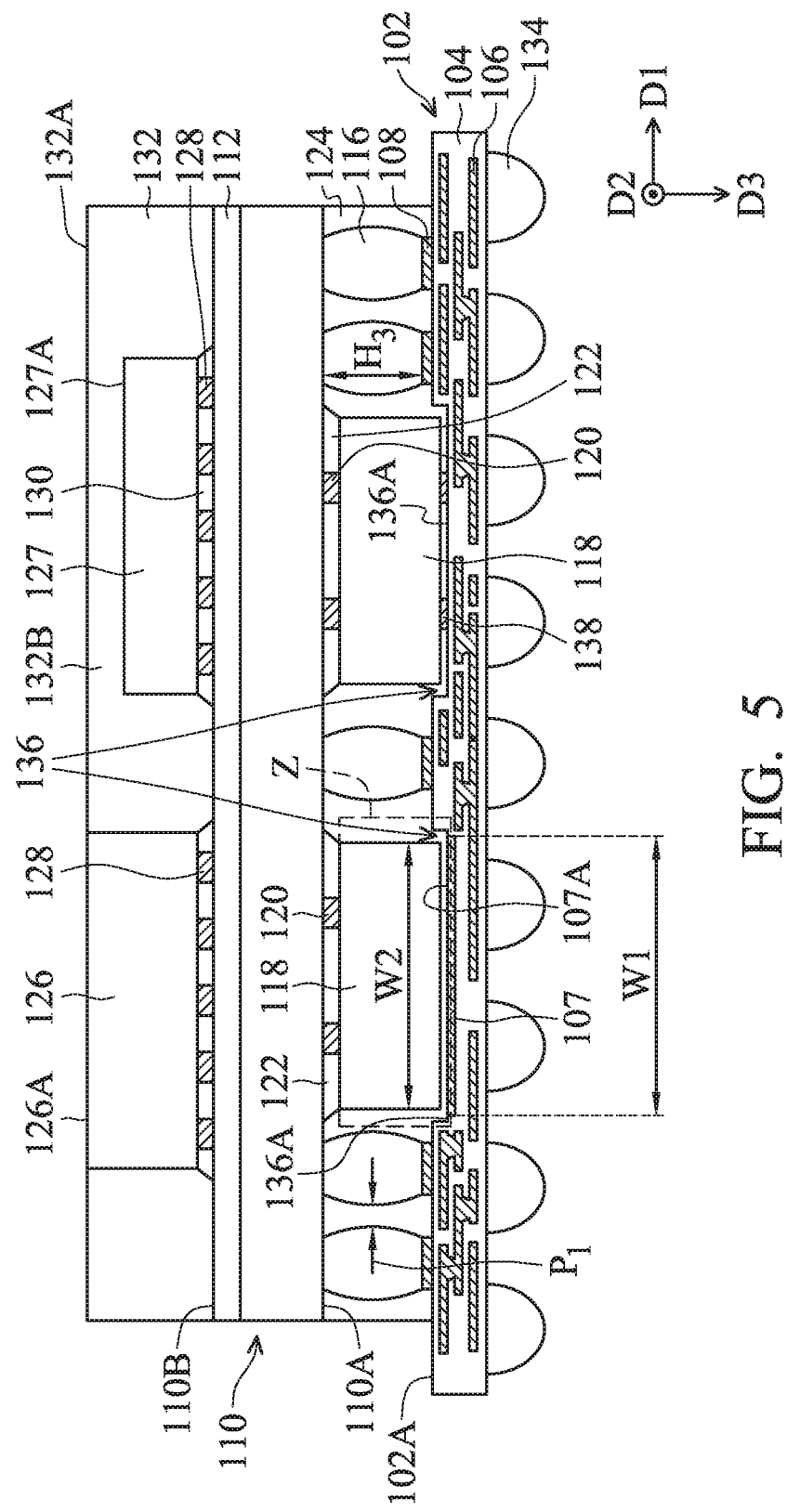
FIG. 5 is a cross-sectional view of a package structure, in accordance with some embodiments.

FIG. 5 is a cross-sectional view of a package structure, in accordance with some embodiments. It should be appreciated that most of the structures in FIG. 5 are the same as those in FIG. 4A, except that a metal plate structure 107 is exposed from the bottom surface 136A of one cavity 136 (e.g., the left one shown in the figure) of the package substrate 102 and located below the respective semiconductor device 118. In some embodiments, the metal plate structure 107 is previously formed in the package substrate 102, and is exposed from the bottom surface 136A of one cavity 136 after forming the cavity 136. The metal plate structure 107 may be configured as an etch stopper to control the depth of the cavity 136 formed. In some embodiments, the metal plate structure 107 is electrically grounded (e.g., without coupled to other electronic devices in the chip package structure), in contrast to the conductive features 106 in the package substrate 102 for routing. While the interposer substrate 110 is stacked over the package substrate 102, the metal plate structure 107 may be configured as a shielding plate to reduce interference of external signals to the overlying semiconductor device 118. In some embodiments, the bottom surface of the semiconductor device 118 is separated from a top surface 107A of the metal plate structure 107 (as well as the bottom surface 136A of the cavity 136) by a gap, for example, greater than about 20 μm. In some embodiments, the metal plate structure 107 has a sectional shape (in the D1-D2 sectional plane shown in the figure) corresponding to that of the semiconductor device 118. In addition, the size W1 of the metal plate structure 107 (in the D1-D2 sectional plane) may be equal to or greater than the size W2 of the semiconductor device 118. In some embodiments, materials of the metal plate structure 107 are the same or similar to those of the conductive features 106 illustrated in FIG. 1A. In some embodiments, the metal plate structure 107 and one of the conductive features 106 are formed in the same process step.

Many variations and/or modifications can be made to embodiments of the disclosure. For example, at least one of the semiconductor devices 118, 126 and 127 in the package structures shown in FIGS. 1-5 may also be or include a package module (as shown in FIG. 6, for example).

Figure 6:
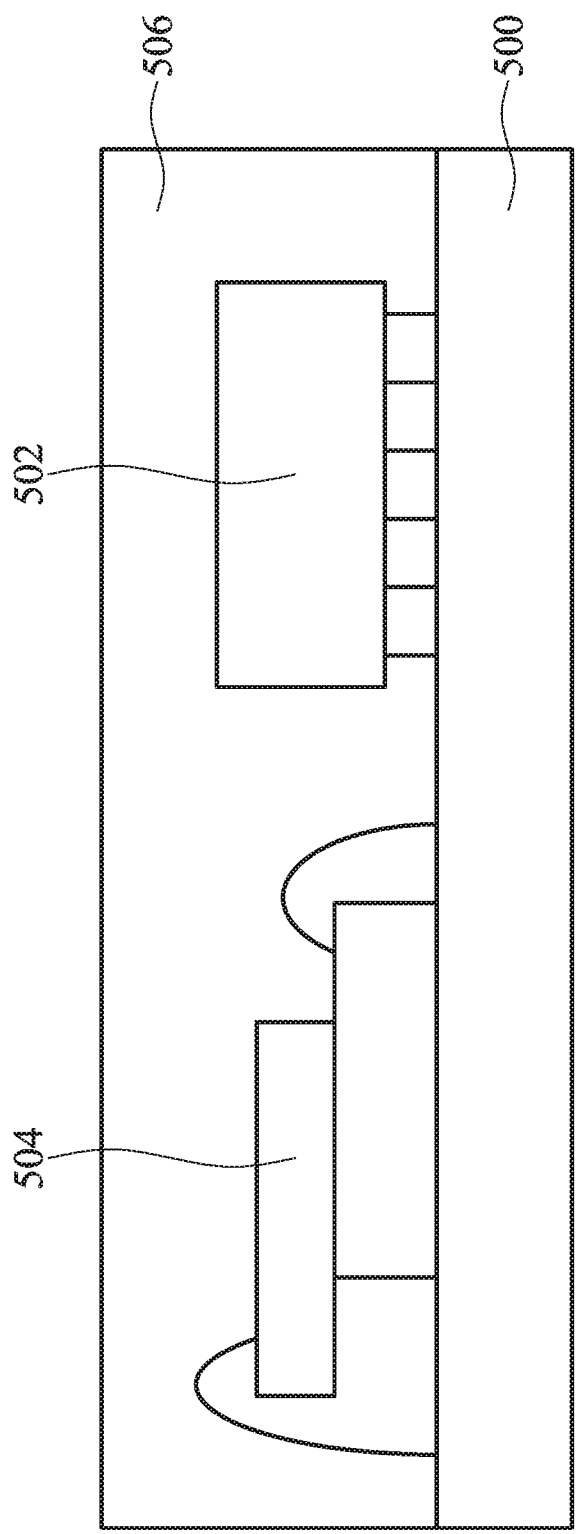
FIG. 6 is a cross-sectional view of a package module, in accordance with some embodiments.

As shown in FIG. 6, a package module includes an interconnection structure 500 and one or more semiconductor dies 502, 504 formed on the interconnection structure 500, in accordance with some embodiments. In various embodiments the semiconductor dies 502, 504 could be any type of semiconductor devices described above. The semiconductor dies 502, 504 may be bonded to the interconnection structure 500 through flip-chip bonding, wire bonding, and/or any other applicable bonding methods. In some embodiments, the interconnection structure 500 is an interposer substrate that carries the semiconductor dies 502, 504 and provides electrical connection between the semiconductor dies 502, 504 and the interposer substrate 110 (see FIGS. 1-5). In these cases, the interconnection structure 500 has a structure that is similar to that of the interposer substrate 110. As shown in FIG. 6, a package module further includes a protective layer 506 formed over the interconnection structure 500 to surround and protect the semiconductor dies 502, 504, in accordance with some embodiments. The materials and formation method of the protective layer 506 may be the same or similar to those of the protective layer 132 illustrated in FIG. 1B.

Embodiments of the disclosure form a package structure including a package substrate, an interposer substrate over the package substrate, one or more first semiconductor devices between the interposer substrate and the package substrate, and one or more second semiconductor devices over the interposer substrate. The first and second semiconductor devices may communicate with each other through some of the conductive features of the interposer substrate. The signal transmission efficiency is therefore significantly improved.

In addition, multiple conductive structures are disposed between the interposer substrate and the package substrate. An underfill material is used to surround and protect the conductive structures. Each first semiconductor device is configured in such a way that the distance from one side of the first semiconductor device to the most adjacent conductive structure is greater than the distance from another side of the first semiconductor device to the most adjacent conductive structure, so as to facilitate the injection of the underfill material and heat dissipation from the first semiconductor device. As a result, the manufacture process of the package structure is improved, and the reliability and performance of the package structure are also improved.

In accordance with some embodiments, a package structure is provided. The package structure includes a package substrate, an interposer substrate, a first semiconductor device, a second semiconductor device, and a plurality of conductive structures. The interposer substrate is disposed over the package substrate, and has a first surface facing the package substrate and a second surface opposite the first surface. The first semiconductor device is disposed on the first surface of the interposer substrate. The second semiconductor device is disposed on the second surface of the interposer substrate. The conductive structures are disposed between the interposer substrate and the package substrate to bond the interposer substrate to the package substrate. The first semiconductor device is located between the conductive structures. A first side of the first semiconductor device is at a first distance from the most adjacent conductive structure in the first direction, and a second side of the first semiconductor device is at a second distance from the most adjacent conductive structure in the first direction. The first side is opposite the second side, and the first distance is greater than the second distance.

In accordance with some embodiments, a package structure is provided. The package structure includes a package substrate, an interposer substrate, two first semiconductor devices, a second semiconductor device, and a plurality of conductive structures. The interposer substrate is disposed over the package substrate, and has a first surface facing the package substrate and a second surface opposite the first surface. The first semiconductor devices are disposed on the first surface of the interposer substrate. The second semiconductor device is disposed on the second surface of the interposer substrate. The conductive structures are disposed between the interposer substrate and the package substrate to bond the interposer substrate to the package substrate. The first semiconductor devices are located between the conductive structures. Each first semiconductor device is configured in such a way that a first side of the first semiconductor device is at a first distance from the most adjacent conductive structure in a first direction, and a second side of the first semiconductor device is at a second distance from the most adjacent conductive structure in the first direction. The first side is opposite the second side, and the first distance is greater than the second distance.

In accordance with some embodiments, a method for forming a package structure is provided. The method includes disposing a first semiconductor device and a plurality of conductive structures on a first surface of an interposer substrate such that the first semiconductor device is located between the conductive structures. A first side of the first semiconductor device is at a first distance from the most adjacent conductive structure in a first direction, and a second side of the first semiconductor device is at a second distance from the most adjacent conductive structure in the first direction. The first side is opposite the second side, and the first distance is greater than the second distance. The method further includes stacking the interposer substrate over a package substrate such that the first surface of the interposer substrate faces the package substrate, and bonding the package substrate to the package substrate through the conductive structures. In addition, the method includes disposing a second semiconductor device on a second surface of the interposer substrate opposite the first surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
a package substrate;
an interposer substrate disposed over the package substrate, wherein the interposer substrate has a first surface facing the package substrate and a second surface opposite the first surface;
a first semiconductor device disposed on the first surface of the interposer substrate;
a second semiconductor device disposed on the second surface of the interposer substrate; and
a plurality of conductive structures disposed between the interposer substrate and the package substrate, configured to bond the interposer substrate to the package substrate, wherein the first semiconductor device is located between the conductive structures, wherein a first side of the first semiconductor device is at a first distance from the most adjacent conductive structure in a first direction, and a second side of the first semiconductor device is at a second distance from the most adjacent conductive structure in the first direction, wherein the first side is opposite the second side, and the first distance is greater than the second distance, wherein the package substrate has an upper surface facing the first surface of the interposer substrate and a cavity formed on the upper surface, wherein the cavity is configured to accommodate the first semiconductor device.

2. The package structure as claimed in claim 1, wherein there is a pitch between every two adjacent conductive structures of the plurality of conductive structures in the first direction, wherein the first distance is greater than or equal to twice the pitch, and the second distance is greater than or equal to the pitch.

3. The package structure as claimed in claim 1, wherein a third side of the first semiconductor device is at a third distance from the most adjacent conductive structure in a second direction that is different from the first direction, and a fourth side of the first semiconductor device is at a fourth distance from the most adjacent conductive structure in the second direction, wherein the third side is opposite the fourth side, and the third distance is equal to the fourth distance.

4. The package structure as claimed in claim 3, wherein there is a pitch between every two adjacent conductive structures of the plurality of conductive structures in the second direction, wherein each of the third distance and the fourth distance is greater than or equal to the pitch.

5. The package structure as claimed in claim 1, wherein the first semiconductor device is separated from the a bottom surface of the cavity by a gap.

6. The package structure as claimed in claim 1, wherein there is a pitch between every two adjacent conductive structures of the plurality of conductive structures, wherein when viewed in a direction perpendicular to the upper surface of the package substrate, a distance between each side of the first semiconductor device and an adjacent wall of the cavity is greater than or equal to the pitch.

7. The package structure as claimed in claim 1, wherein the first semiconductor device extends into the cavity and is further electrically connected to the package substrate at a bottom surface of the cavity.

8. The package structure as claimed in claim 1, wherein there is a metal plate structure exposed from a bottom surface of the cavity and located below the first semiconductor device.

9. A package structure, comprising:
a package substrate;
an interposer substrate disposed over the package substrate, wherein the interposer substrate has a first surface facing the package substrate and a second surface opposite the first surface;
two first semiconductor devices disposed on the first surface of the interposer substrate;
a second semiconductor device disposed on the second surface of the interposer substrate; and
a plurality of conductive structures disposed between the interposer substrate and the package substrate, configured to bond the interposer substrate to the package substrate, wherein the two first semiconductor devices are located between the conductive structures, wherein each of the two first semiconductor devices is configured in such a way that:

a first side of the first semiconductor device is at a first distance from the most adjacent conductive structure in a first direction, and a second side of the first semiconductor device is at a second distance from the most adjacent conductive structure in the first direction, wherein the first side is opposite the second side, and the first distance is greater than the second distance, wherein the package substrate has an upper surface facing the first surface of the interposer substrate and a cavity formed on the upper surface, wherein the cavity is configured to accommodate at least one of the two first semiconductor devices.

10. The package structure as claimed in claim 9, wherein there is a pitch between every two adjacent conductive structures of the plurality of conductive structures in the first direction, wherein the first distance is greater than or equal to twice the pitch, and the second distance is greater than or equal to the pitch.

11. The package structure as claimed in claim 9, wherein each of the two first semiconductor devices is further configured in such a way that:

a third side of the first semiconductor device is at a third distance from the most adjacent conductive structure in a second direction that is different from the first direction, and a fourth side of the first semiconductor device is at a fourth distance from the most adjacent conductive structure in the second direction, wherein the third side is opposite the fourth side, and the third distance is equal to the fourth distance.

12. The package structure as claimed in claim 11, wherein there is a pitch between every two adjacent conductive structures of the plurality of conductive structures in the second direction, wherein each of the third distance and the fourth distance is greater than or equal to the pitch.

13. The package structure as claimed in claim 9, wherein there is a pitch between every two adjacent conductive structures of the plurality of conductive structures, wherein the two first semiconductor devices are arranged side by side, and a space between the first sides of the two first semiconductor devices is greater than or equal to twice the pitch.

14. The package structure as claimed in claim 9, wherein the at least one of the two first semiconductor devices extends into the cavity and is further electrically connected to the package substrate at a bottom surface of the cavity.

15. The package structure as claimed in claim 9, wherein a depth of the cavity in a vertical direction perpendicular to the upper surface of the package substrate does not exceed 50% of a thickness of the package substrate in the vertical direction.

16. A method for forming a package structure, comprising:
disposing a first semiconductor device and a plurality of conductive structures on a first surface of an interposer substrate such that the first semiconductor device is located between the conductive structures, wherein a first side of the first semiconductor device is at a first distance from the most adjacent conductive structure in a first direction, and a second side of the first semiconductor device is at a second distance from the most adjacent conductive structure in the first direction, wherein the first side is opposite the second side, and the first distance is greater than the second distance;

stacking the interposer substrate over a package substrate such that the first surface of the interposer substrate faces the package substrate, and bonding the interposer substrate to the package substrate through the plurality of conductive structures; and disposing a second semiconductor device on a second surface of the interposer substrate opposite the first surface, wherein before stacking the interposer substrate over the package substrate, the method further comprises forming a cavity on an upper surface of the package substrate, wherein after stacking the interposer substrate over the package substrate, the first semiconductor device extends into the cavity.

17. The method as claimed in claim 16, wherein there is a pitch between every two adjacent conductive structures of the plurality of conductive structures in the first direction,
wherein the first distance is greater than or equal to twice the pitch, and the second distance is greater than or equal to the pitch.

18. The method as claimed in claim 16, wherein before stacking the interposer substrate over the package substrate, the method further comprises dispensing an underfill material from the first side of the first semiconductor device to surround and protect joints between the first semiconductor device and the first surface of the interposer substrate.

19. The method as claimed in claim 16, wherein after forming the cavity of the package substrate, a metal plate structure is exposed from a bottom surface of the cavity and located below the first semiconductor device.

20. The method as claimed in claim 16, wherein after stacking the interposer substrate over the package substrate, the method further comprises electrically connecting the first semiconductor device to the package substrate at a bottom surface of the cavity.

* * * * *